United States Patent
Dluhos

(10) Patent No.: US 12,288,665 B2
(45) Date of Patent: Apr. 29, 2025

(54) SAMPLE DISPLAY METHOD

(71) Applicant: Tescan Brno s.r.o., Brno (CZ)

(72) Inventor: Jiri Dluhos, Brno (CZ)

(73) Assignee: Tescan Brno s.r.o., Brno (CZ)

(*) Notice: Subject to any disclaimer, the term of this patent is extended or adjusted under 35 U.S.C. 154(b) by 447 days.

(21) Appl. No.: 17/996,925

(22) PCT Filed: Apr. 23, 2021

(86) PCT No.: PCT/CZ2021/050044
§ 371 (c)(1),
(2) Date: Oct. 21, 2022

(87) PCT Pub. No.: WO2021/213560
PCT Pub. Date: Oct. 28, 2021

(65) Prior Publication Data
US 2023/0178329 A1    Jun. 8, 2023

(30) Foreign Application Priority Data
Apr. 23, 2020  (CZ) ................ CZ2020-232

(51) Int. Cl.
*H01J 37/147* (2006.01)
*H01J 37/20* (2006.01)
*H01J 37/28* (2006.01)

(52) U.S. Cl.
CPC .......... *H01J 37/1474* (2013.01); *H01J 37/20* (2013.01); *H01J 37/28* (2013.01); *H01J 2237/1536* (2013.01)

(58) Field of Classification Search
CPC ........ H01J 37/00; H01J 37/02; H01J 37/1474; H01J 37/20; H01J 37/26; H01J 37/28; H01J 37/1472; H01J 2237/1536
(Continued)

(56) References Cited

U.S. PATENT DOCUMENTS 6,674,075 B2    1/2004  Petrov et al.
2003/0209667 A1* 11/2003 Petrov ................... G01N 23/22
                                                    250/310

(Continued)

FOREIGN PATENT DOCUMENTS

CZ         306807       7/2017
EP         0051733 B1   2/1984

OTHER PUBLICATIONS

European Patent Office, International Search Report, mailed Jul. 19, 2021, in International Patent Application No. PCT/CZ2021/050044, filed Apr. 23, 2021.
(Continued)

*Primary Examiner* — Jason L McCormack
(74) *Attorney, Agent, or Firm* — Thedford I. Hitaffer; Hitaffer & Hitaffer, PLLC

(57) ABSTRACT

A sample display method by means of a scanning electron microscope comprises at most one active objective lens located above a first scanning element and a second scanning element. A primary electron beam is deflected so as to be focused by an objective lens so that the beam propagates from the second scanning element towards a sample approximately parallel to the SEM optical axis, wherein the sample is also tilted relative to the SEM optical axis by an angle other than 90°, or it is a sample with distinct topography.

3 Claims, 3 Drawing Sheets

(58) Field of Classification Search
USPC .................................. 250/306, 307, 310, 311
See application file for complete search history.

(56) References Cited

U.S. PATENT DOCUMENTS

| 2006/0043293 | A1* | 3/2006 | Doi .......................... H01J 37/28 |
| | | | 250/492.22 |
| 2007/0221860 | A1* | 9/2007 | Kawasaki ........... H01J 37/1478 |
| | | | 250/398 |
| 2016/0351371 | A1 | 12/2016 | Li et al. |
| 2018/0031498 | A1 | 2/2018 | Shiratsuchi et al. |

OTHER PUBLICATIONS

European Patent Office, Written Opinion, mailed Jul. 19, 2021, in International Patent Application No. PCT/CZ2021/050044, filed Apr. 23, 2021.
J.T.L. Thong, B.C. Breton: A topography measurement instrument based on the scanning electron microscope, Review of Scientific Instruments, vol. 63, Issue 1, (1992); https://doi.org/10.1063/1.1143057, Published Online: Jun. 4, 1998, [Retrieved on Oct. 13, 2020], Retrieved from.

* cited by examiner

SAMPLE DISPLAY METHOD

CROSS-REFERENCE TO RELATED APPLICATIONS

This application, filed under 35 USC 371, is a United States National Stage Application of International Application No. PCT/CZ2021/050044, filed Apr. 23, 2021, which claims priority to CZ PV 2020-232, filed Apr. 23, 2020, the disclosures of which are incorporated herein by reference in their entirety.

FIELD OF THE INVENTION

The invention is related to a sample display method by means of a scanning electron microscope and particularly to a method of displaying a tilted sample and a sample with distinct topography.

BACKGROUND OF THE INVENTION

Scanning electron microscopes (SEM) usually comprise a source of primary electrons, at least one condenser lens and an aperture diaphragm, wherein the condenser lens regulates, in conjunction with the aperture diaphragm, current of a beam of primary electrons of at least one objective lens, scanning and centering elements, and a detector of signal electrons. As disclosed, e.g., in patent CZ306807, these elements are usually arranged under one another in such way that the beam of primary electrons first passes through the condenser lens, then through centering elements, scanning elements, and the objective lens. In a different arrangement, the beam of electrons, before it passes through scanning elements, and after it passes through centering elements, can pass through another objective lens, as disclosed in the presented patent. Objective lenses are usually electromagnetic. An electromagnetic lens consists of a coil with a current, and a case from magnetic material, constituting a part of the coil magnetic circuit. In the place where the coil case is interrupted a magnetic field which forms the beam of electrons appears between the so-called pole pieces. In one of the possible embodiments the electromagnetic lens can be the so-called conventional one. The conventional lens comprises of two pole pieces with an axial gap, in which the lens magnetic field locally affects the flow of primary electrons (electron beam) and does not substantially reach the sample area.

Electromagnetic lenses can be also replaced with electrostatic lenses which use electrodes instead of coils, or it is possible to make combined lens with connection of coils, a magnetic circuit and electrodes.

Such SEMs usually allow for various display systems based on the required parameters for the final image, which include resolution and depth of field given by the aperture angle size. The resolution is given by the spot size created by primary electrons while impinging the sample, wherein the spot size is also affected by the aperture angle size. One of possible display modes is a display mode with a large aperture angle in which the depth of field is low and the resolution is high. In contrast, another possible display mode is a display mode with a small aperture angle in which the depth of field is high and the resolution is low. Another of the required parameters is the size of field of view; this property is, among other things, affected by the location of the center point of scanning (pivot), through which primary electron paths pass during sample scanning, wherein this pivot is usually located at the level of objective lens, located behind the scanning elements along SEM optical axis in the direction of primary electron beam propagation, or between the said objective lens and scanning elements. In the case of the display mode with a large aperture angle, in order to reach the highest possible resolution, the pivot is located at the level of the objective lens, located behind the scanning elements along the SEM optical axis in the direction of primary electron beam propagation, but the field of view is therefore minimal. When a large field of view is required, the pivot is located above the level of the objective lens, located behind the scanning elements along the SEM optical axis in the direction of primary electron beam propagation, and under scanning elements.

In all the above-mentioned display modes, during scanning of the beam of primary electrons there is a central projection on the sample, which leads to the beam impinging on the sample under a certain angle relative to a given point of scanning on the sample. The display distortion is accentuated by perspective distortion, especially if the samples are tilted relative to the normal to SEM optical axis or if the samples have a distinct topography. The distortion is thus caused by the fact that more distant objects seem smaller than closer objects. This distortion is undesirable when making a panoramic image. The panoramic image is created by combining more images from a larger sample area. Therefore, this distortion is undesirable since it makes difficult to accurately connect the panoramic image during its production with the use of movement of a sample without a distinct topography, and completely prevents accurate connection of the panoramic image of samples with distinct topography. During central scanning by a beam of primary electrons across the sample, this beam does not impinge every point of the sample under the same angle, rather, this angle changes, which causes obtaining distorted information for techniques sensitive to beam impinging angle, e.g., electron diffraction or electron channeling effect.

Documents describing increased effectiveness of detectors of signal electrons are also known. An example includes a U.S. Pat. No. 6,674,075B2 which describes use of an in-lens detector of secondary electrons which is located around the scanning electron microscope optical axis and which further discloses deflection of a beam of primary electrons in such way that the beam of primary electrons propagates towards the sample along a parallel axis but remote from the scanning electron microscope optical axis, thus causing the beam of secondary electrons to subsequently propagate towards the detection area of the in-lens detector of secondary electrons and not to impinge opening therein with the beam of primary electrons passing therethrough. A drawback of this patent is that does not allow scanning of the beam of primary electrons across the sample in a place where the sample is intersected by the scanning electron microscope optical axis, and it is therefore not suitable for producing panoramic images, since extensive sample movement would be necessary in order to scan also the place on the sample, through which the scanning electron microscope optical axis originally passed. However, extensive sample movement can lead to distortion of the final panoramic image e.g., due to inaccuracies of the sample holder movement, or to more complicated compiling thereof due to higher number of images. In addition, further image distortion during image scanning according to this patent can be caused by locations of scanning elements in such way that both deflection fields are in front of the field generated by the objective lens, or one is in front of the field generated by the objective lens and one is in the field generated by the objective lens, or one is in the field generated by the objective lens and one is behind the field generated by the objective lens. Each variant involves affecting of already deflected primary beam or primary beam being deflected by a field generated by the objective lens, and thus to further distortion, which is undesirable for the purposes of, for example, making a panoramic image.

Therefore, it would be desirable to provide a solution which would allow for displaying a tilted sample or a sample with distinct topography without the final image distortion and also without the need to use other physical elements affecting the direction of passage of the beam of primary electrons or signal electrons, or without the need for extensive sample movement.

SUMMARY OF THE INVENTION

The above mentioned goal is achieved by a sample display method by means of a scanning electron microscope comprising a scanning electron microscope column connected to a working chamber, wherein the scanning electron microscope column comprises a source of primary electrons arranged for emitting a beam of primary electrons, at least one condenser lens, an aperture diaphragm, a first scanning element, and a second scanning element, which is located in the direction of the primary electron beam propagation behind the first scanning element, at most one active objective lens, which is located between the first scanning element and the condenser lens, wherein the working chamber comprises a sample holder and a sample placed on the sample holder, wherein the beam of primary electrons, which are emitted by the source of primary electrons, and which passed through the condenser lens, the aperture diaphragm, and the objective lens, is deflected by the first scanning element and the second scanning element, in case of scanning across the sample including the place on the sample intersecting the scanning electron microscope optical axis, so that in one point on the sample it intersects the scanning electron microscope optical axis, and the subject matter of which is based on the fact that the beam of primary electrons is simultaneously deflected by the first scanning element and the second scanning element so that during scanning across the sample it impinges the sample parallel to the scanning electron microscope optical axis. The sample display method by means of a scanning electron microscope achieves the above-mentioned goal in such way that the deflection of the beam of primary electrons during scanning across the sample occurs in such way that the beam of primary electrons impinges the sample approximately parallel with the scanning electron microscope optical axis. Therefore, the beam of primary electrons impinges every point in the sample under the same angle and thus no distortion of the final image occurs.

Sample display method by means of a scanning electron microscope comprising a scanning electron microscope column connected to a working chamber, wherein the scanning electron microscope column comprises a source of primary electrons arranged for emitting a beam of primary electrons, at least one condenser lens, an aperture diaphragm, a first scanning element, and a second scanning element, which is located in the direction of the primary electron beam propagation behind the first scanning element, at most one active objective lens, which is located between the first scanning element and the condenser lens, wherein the working chamber comprises a sample holder and a sample placed on the sample holder, wherein the sample has a height difference of at least 10 nm between the highest point of the sample and the lowest point of the sample along the axis parallel with the scanning electron microscope optical axis, wherein the beam of primary electrons which are emitted by the source of primary electrons, and which passed through the condenser lens, the aperture diaphragm, and the objective lens, is, in case of scanning across the sample including the place on the sample intersecting the scanning electron microscope optical axis, deflected by the first scanning element and the second scanning element so that in one point on the sample it intersects the scanning electron microscope optical axis, and the subject matter of which is based on the fact that the beam of primary electrons is simultaneously deflected by the first scanning element and the second scanning element so that during scanning across the sample it impinges the sample parallel to the scanning electron microscope optical axis. The sample display method by means of the scanning electron microscope achieves the above-mentioned goal of displaying the sample with distinct topography in such way that the deflection of the beam of primary electrons during scanning across the sample occurs in such way that the beam of primary electrons impinges the sample with distinct topography approximately parallel with the scanning electron microscope optical axis. Therefore, the beam of primary electrons impinges every point in the sample under the same angle and thus there is no distortion of the final image and no inaccuracies of scanning due to scanning of the sample with distinct topography under various impinging angles of the beam of primary electrons onto individual points on the sample.

Sample display method by means of a scanning electron microscope comprising a scanning electron microscope column connected to a working chamber, wherein the scanning electron microscope column comprises a source of primary electrons arranged for emitting a beam of primary electrons, at least one condenser lens, an aperture diaphragm, a first scanning element, and a second scanning element, which is located in the direction of the primary electron beam propagation behind the first scanning element, at most one active objective lens, which is located between the first scanning element and the condenser lens, wherein the working chamber comprises a sample holder which is positioned relative to the scanning electron microscope column optical axis in an angle other than 90°, and a sample placed on the sample holder, wherein the beam of primary electrons which are emitted by the source of primary electrons, and which passed through the condenser lens, the aperture diaphragm, the objective lens, is, in the case of scanning across the sample including the place on the sample intersecting the scanning electron microscope optical axis, deflected by the first scanning element and the second scanning element so that in one point on the sample it intersects the scanning electron microscope optical axis, and the subject matter of which is based on the fact that the beam of primary electrons is simultaneously deflected by the first scanning element and the second scanning element so that during scanning across the sample it impinges the sample parallel to the scanning electron microscope optical axis. The sample display method by means of the scanning electron microscope achieves the above-mentioned goal of displaying the tilted sample in such way that the deflection of the beam of primary electrons during scanning across the sample occurs in such way that the beam of primary electrons impinges the tilted sample approximately parallel with the scanning electron microscope optical axis. Therefore, the beam of primary electrons impinges every point in the sample under the same angle and thus there is no distortion of the final image and no scanning inaccuracies due to perspective projection during scanning of the tilted sample, which also allows for accurate connection of adjacent images during scanning of an area larger than one single field of view by means of sample movement.

DESCRIPTION OF DRAWINGS

The subject matter of the invention is further described by way of examples of the embodiments thereof, which are described by means of the accompanying drawings in which.

EXEMPLARY EMBODIMENTS OF THE INVENTION

The embodiments herein represent exemplary embodiments of the invention, which, however, have no limiting effect in terms of the scope of protection.

Figure 1:
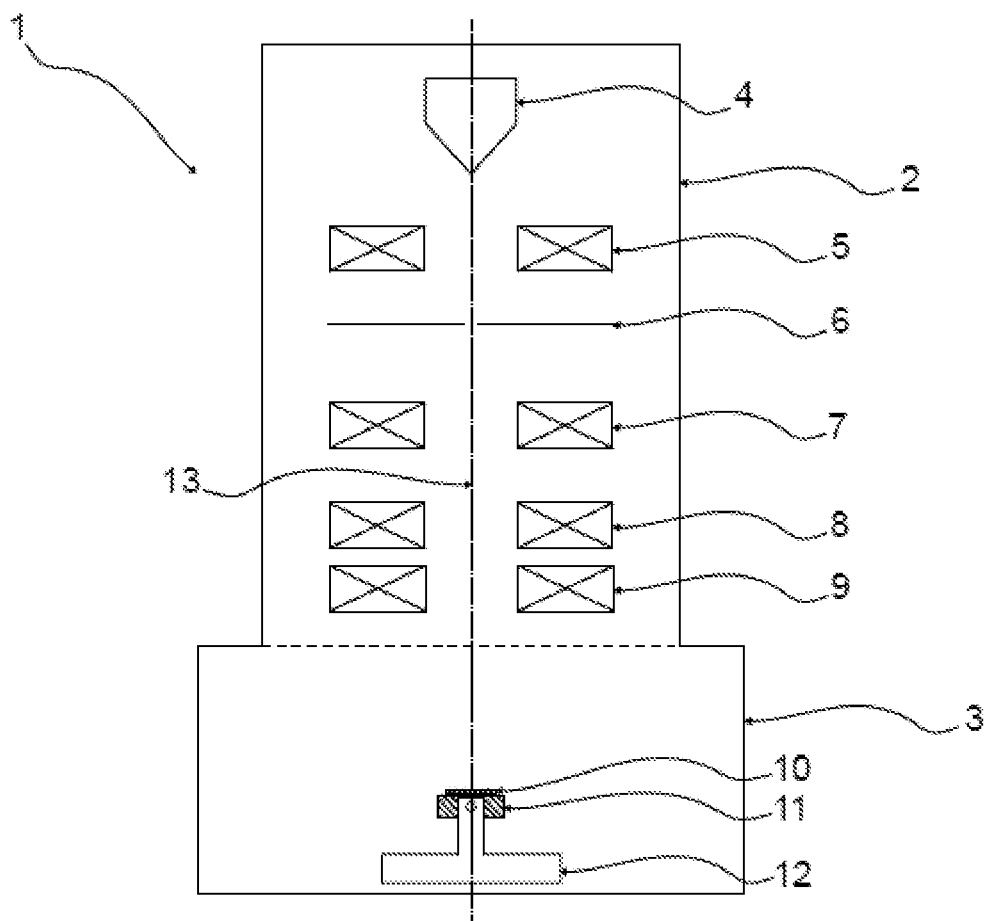
FIG. 1 is a schematic view of arrangement of individual elements of SEM.

An exemplary embodiment of the invention is a sample scanning method by means of a scanning electron microscope 1 (SEM) shown in FIG. 1. The SEM comprises a working chamber 3 and a SEM column 2 connected to the working chamber 3. The working chamber 3 and the SEM column 2 are arranged for allowing generation of lower pressure in the working chamber 3 and the SEM column 2 than atmospheric pressure, by means of a pump system connected to the working chamber 3 and the SEM column 2.

The working chamber 3 comprises a sample holder 11. The sample holder 11 comprises a contact part arranged for accommodating a sample 10. In the first exemplary embodiment of the sample holder 11 the sample holder 11 can be tilted around three mutually perpendicular axes. In the second exemplary embodiment of the sample holder 11 the sample holder 11 can be tilted around a single axis. In one of the exemplary embodiments of the working chamber 3 the sample holder 11 is located on a manipulation stage 12. The manipulation stage 12 is arranged for movement along at least two mutually perpendicular axes, which are also in one of the exemplary embodiments of the manipulation stage 12 perpendicular to the SEM optical axis 13. The working chamber further comprises a detector of signal particles, such as secondary electrons, back-scattered electrons or characteristic X-ray radiation.

The SEM column 2 comprises a source 4 of primary electrons, at least one condenser lens 5, an aperture diaphragm 6, at most one active objective lens 7 and a first scanning element 8 and a second scanning element 9, wherein all these elements are located inside the SEM column 1. The source 4 of primary electrons is arranged for emitting a beam of primary electrons. The source 4 of primary electrons can be, for example, a thermoemissive or an autoemissive source. The condenser lens 5 is located behind the source 4 of primary electrons along the SEM optical axis 13 in the direction of primary electron beam propagation. The condenser lens 5 is arranged for modifying the beam of primary electrons, wherein in one of the exemplary embodiments, in combination with the aperture diaphragm 6 it is arranged for modifying the size of the flow of the beam of primary electrons. The first scanning element 8 and the second scanning element 9 are arranged for applying force field on the beam of primary electrons, which is, based on this action, deflected relative to the SEM optical axis 13. The first scanning element 8 and the second scanning element 9 can be designed as electromagnetic scanning coils or as electrostatic scanning electrodes. The aperture diaphragm 6 is located behind the condenser lens 5 along the SEM optical axis 13 in the direction of primary electron beam propagation. The objective lens 7 is located behind the aperture diaphragm 6 along the SEM optical axis 13 in the direction of primary electron beam propagation. The objective lens 7 is arranged for focusing the beam of primary electrons so that the beam of primary electrons impinges the sample 10 with a required aperture angle. By active objective lens 7 is meant a state of the objective lens 7, in which the objective lens 7 focuses the beam of primary electrons. The first scanning element 8 is located behind the objective lens 7 along the SEM optical axis 13 in the direction of primary electron beam propagation. The second scanning element 9 is located behind the first scanning element 8 along the SEM optical axis 13 in the direction of primary electron beam propagation.

Figure 2:
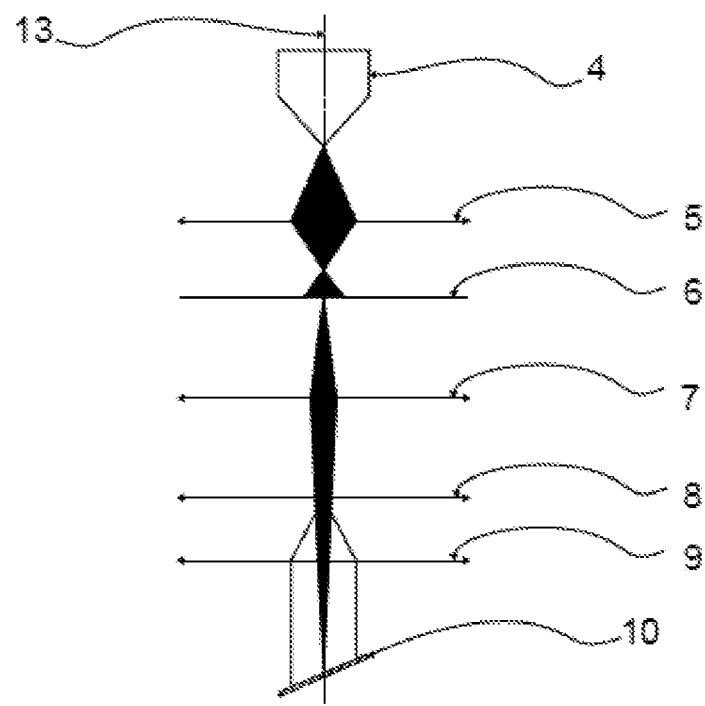
FIG. 2 is a schematic view of a course of primary electron beam propagation through a SEM column and upon impinging a sample tilted relative to the SEM optical axis under an angle other than 90°.

In the first exemplary embodiment of the sample holder 11 configuration and the sample 10 shown in FIG. 2, the sample holder 11 with the sample 10 is tilted relative to the SEM optical axis 13, so that the displayed sample 10 plane is tilted relative to the SEM optical axis 13 by an angle other than 90° and at the same time other than 0° and the sample 10 is any sample 10 arranged for be placed on the sample holder 11 and in the working chamber 3.

Figure 3:
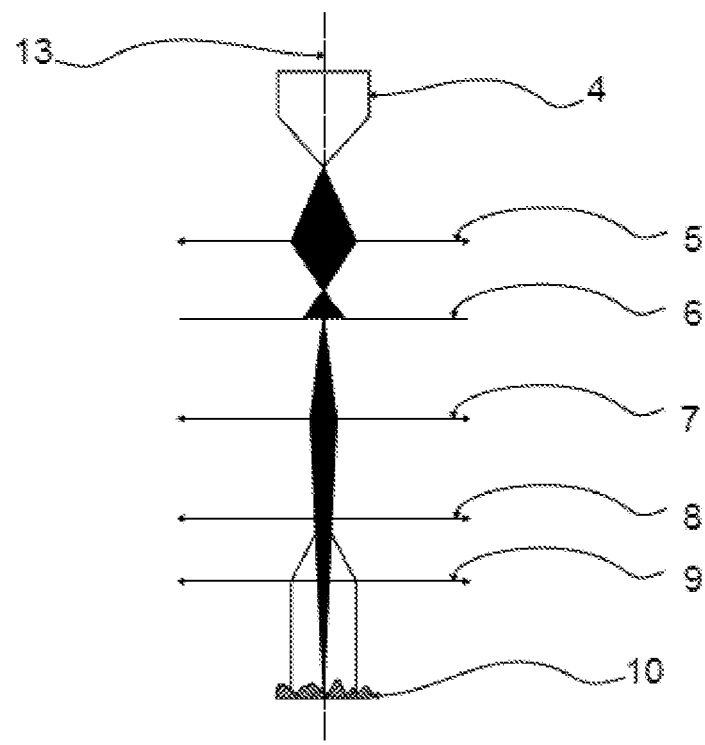
FIG. 3 is a schematic view of a course of primary electron beam propagation through a SEM column and upon impinging a sample with distinct topography.
Figure 4:
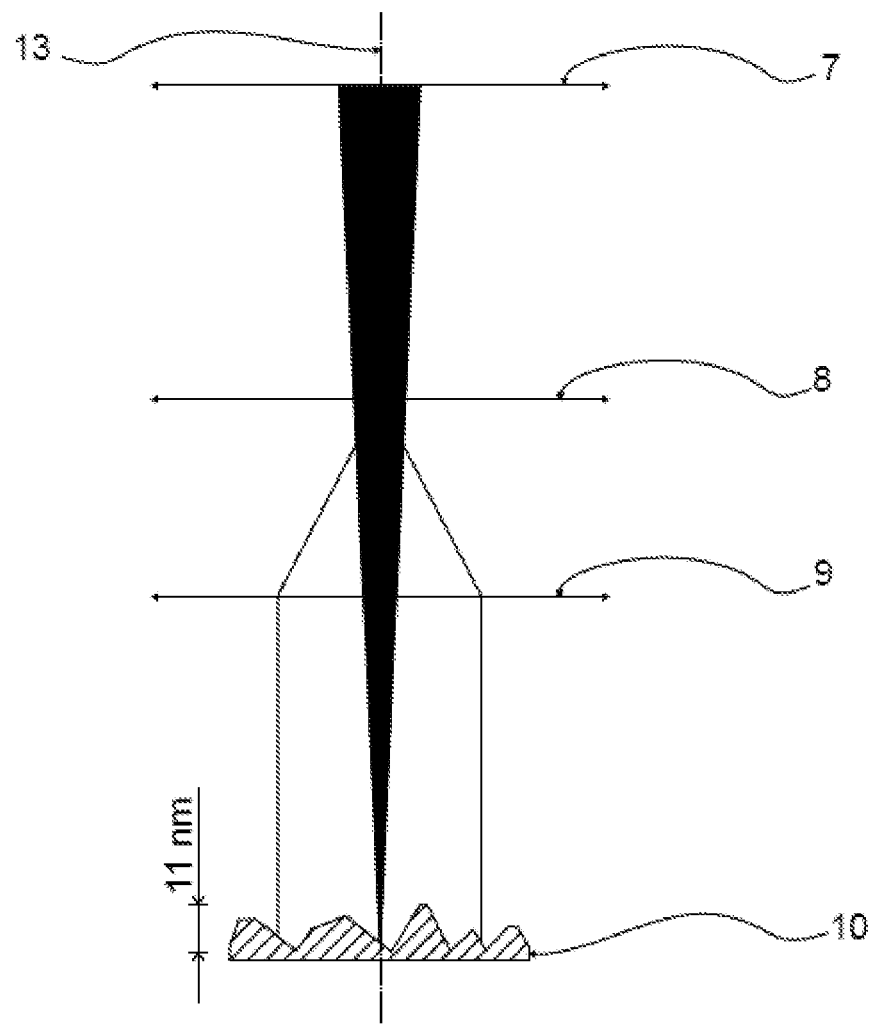
FIG. 4 is a schematic view of a detail of a sample with distinct topography and impinging beam of primary electrons.

In the second exemplary embodiment of the sample holder 11 configuration and the sample 10 shown in FIG. 3, the sample holder 11 with the sample 10 is tilted relative to the SEM optical axis 13 under any angle, wherein the displayed sample 10 is a sample 10 with distinct topography. The sample 10 with distinct topography means any sample 10, which has in any axis of the sample 10 parallel to the SEM optical axis 13 the height difference of at least 10 nm between the highest and the lowest point of the sample, as seen in more detail in FIG. 4.

In the exemplary embodiment shown in FIGS. 2 and 3, at first the beam of primary electrons is emitted by the source 4 of primary electrons. The beam of primary electrons then passes through the condenser lens 5 and the aperture diaphragm 6. Then the beam of primary electrons passes through the objective lens 7, which focuses the beam of primary electrons, so that it impinges the sample 10 under aperture angle in the range of 0° to 30°. Such focused beam of primary electrons passes through the first scanning element 8 and the second scanning element 9, when the first scanning element 8 deflects the beam of primary electrons from the SEM optical axis 13 and the second scanning element 9 deflects the deflected beam of primary electrons so that it further propagates towards the sample 10 parallel to the SEM optical axis 13. When talking about parallel primary electron beam propagation, it is meant that the center of the beam of primary electrons propagates in a parallel way. Such deflection of the beam moves pivot to much bigger distance than the distance between the second scanning element 9 and the sample 10.

LIST OF REFERENCE SIGNS

1—Scanning electron microscope (SEM)
2—SEM column

3—Working chamber
4—Source of primary electrons
5—Condenser lens
6—Aperture diaphragm
7—Objective lens
8—First scanning element
9—Second scanning element
10—Sample
11—Sample holder
12—Manipulation stage
13—SEM optical axis

The invention claimed is:

1. A sample display method by means of a scanning electron microscope comprising a scanning electron microscope column, connected to a working chamber, wherein the scanning electron microscope column comprises a source of primary electrons arranged for emitting a beam of primary electrons, at least one condenser lens, an aperture diaphragm, a first scanning element, and a second scanning element, which is located in the direction of the primary electron beam propagation behind the first scanning element, at most one active objective lens, which is located between the first scanning element and the condenser lens, wherein the working chamber comprises a sample holder and a sample placed on the sample holder, wherein the beam of primary electrons, which are emitted by the source of primary electrons, and which passed through the condenser lens, the aperture diaphragm, and the objective lens, is, in the case of scanning across the sample, including the place on the sample intersecting the scanning electron microscope optical axis, deflected by the first scanning element and the second scanning element so that in one point on the sample it intersects the scanning electron microscope optical axis, wherein the primary electron beam is simultaneously deflected by the first scanning element and the second scanning element, so that during scanning across the sample, the primary electron beam impinges the sample parallel to the scanning electron microscope optical axis.

2. A sample display method by means of a scanning electron microscope comprising a scanning electron microscope column connected to a working chamber, wherein the scanning electron microscope column comprises a source of primary electrons arranged for emitting a beam of primary electrons, at least one condenser lens, an aperture diaphragm, a first scanning element, and a second scanning element, which is located in the direction of the primary electron beam propagation behind the first scanning element, at most one active objective lens, which is located between the first scanning element and the condenser lens(s), wherein the working chamber comprises a sample holder and a sample placed on the sample holder, wherein the sample has a height difference of at least 10 nm between the highest point of the sample and the lowest point of the sample along the axis parallel with the scanning electron microscope optical axis, wherein the beam of primary electrons which are emitted by the source of primary electrons, and which passed through the condenser lens, the aperture diaphragm, and the objective lens, is, in the case of scanning across the sample, including the place on the sample intersecting the scanning electron microscope optical axis, deflected by the first scanning element and the second scanning element so that in one point on the sample it intersects the scanning electron microscope optical axis, and character therein the primary electron beam is simultaneously deflected by the first scanning element and the second scanning element, so that during scanning across the sample, the primary electron beam impinges the sample parallel to the scanning electron microscope optical axis.

3. A sample display method by means of a scanning electron microscope comprising a scanning electron microscope column connected to a working chamber, wherein the scanning electron microscope column comprises a source of primary electrons arranged for emitting a beam of primary electrons, at least one condenser lens, an aperture diaphragm, a first scanning element, and a second scanning element, which is located in the direction of the primary electron beam propagation behind the first scanning element, at most one active objective lens, which is located between the first scanning element and the condenser lens, wherein the working chamber comprises a sample holder, which is placed relative to the scanning electron microscope column optical axis tilted by an angle other than 90°, and a sample placed on the sample holder, wherein the beam of primary electrons which are emitted by the source of primary electrons, and which passed through the condenser lens, the aperture diaphragm, and the objective lens, is, in the case of scanning across the sample including the place on the sample intersecting the scanning electron microscope optical axis, deflected by the first scanning element and the second scanning element so that in one point on the sample, the primary electron beam intersects the scanning electron microscope optical axis, and wherein the primary electron beam is simultaneously deflected by the first scanning element and the second scanning element so that during scanning across the sample, the primary electron beam impinges the sample parallel to the scanning electron microscope optical axis.

* * * * *